United States Patent [11] 3,621,346

[72] Inventors Joseph J. Chang
Clearwater Beach, Vt.;
Madhukar B. Vora, Beacon, N.Y.
[21] Appl. No. 6,493
[22] Filed Jan. 28, 1970
[45] Patented Nov. 16, 1971
[73] Assignee International Business Machines Corporation
Armonk, N.Y.

[54] PROCESS FOR FORMING SEMICONDUCTOR DEVICES WITH POLYCRYSTALLINE DIFFUSION PATHWAYS AND DEVICES FORMED THEREBY
6 Claims, 13 Drawing Figs.

[52] U.S. Cl. 317/235, 317/235 AT, 317/235 D, 317/235 E
[51] Int. Cl. H01l 11/00
[50] Field of Search 317/235 AT, 235 D, 235 E, 235 (46.5)

[56] References Cited
UNITED STATES PATENTS

| | | | |
|---|---|---|---|
| 3,475,661 | 10/1969 | Iwata | 317/234 |
| 3,316,130 | 4/1967 | Dash | 148/175 |
| 3,433,684 | 3/1969 | Zanowick | 148/33.4 |

FOREIGN PATENTS

| | | | |
|---|---|---|---|
| 1,926,884 | 12/1969 | Germany | 317/235 |

*Primary Examiner*—John W. Huckert
*Assistant Examiner*—Martin H. Edlow
*Attorney*—Sughrue, Rothwell, Mion, Zinn & Macpeak ABSTRACT: A process wherein epitaxial silicon is grown on a substrate of single-crystal silicon with islands of silicon dioxide thereon, whereby single crystal epitaxial material is grown over the single-crystal substrate areas, but polycrystalline silicon is grown over the silicon dioxide islands. Since impurity diffusion occurs more rapidly through polycrystalline material than through single-crystalline material diffusion schemes can be obtained using the rapid diffusion pathway provided by the polycrystalline material to provide subsurface configurations which are completely enclosed by single-crystal material, for instance, a buried subcollector can be formed by growing polycrystalline silicon material horizontally, extending a narrow polycrystalline channel upward to the device surface, and subsequently diffusing impurities down through the narrow vertical polycrystalline channel into the lateral polycrystalline subcollector. Further, an electrical underpass can be formed which has a very low resistance by again using the rapid diffusion characteristics of polycrystalline silicon to grow polycrystalline silicon of the desired shape which can be rapidly diffused to provide, in comparison to background, a high conductivity path.
By control of the substrate crystalline orientation, polycrystalline material can be grown which terminates because of sidewall convergence. This is desirable where it is required to terminate polycrystalline growth and begin single-crystal growth without any alteration in process conditions. The devices described are also claimed.

INVENTORS
JOSEPH J. CHANG
MADHUKAR B VORA

BY Sughrue, Rothwell, Mion, Zinn & Macpeak
ATTORNEYS

PROCESS FOR FORMING SEMICONDUCTOR DEVICES WITH POLYCRYSTALLINE DIFFUSION PATHWAYS AND DEVICES FORMED THEREBY

BACKGROUND OF THE INVENTION

1. Field of the Invention

The present invention relates to the epitaxial growth of polycrystalline silicon in semiconductor devices and to devices utilizing polycrystalline silicon as an integral feature thereof.

2. Background of the Prior Art

The prior art has known that monocrystalline and polycrystalline areas can be simultaneously grown in the formation of an epitaxial layer. This is taught in IBM Technical Disclosure Bulletin, Vol. 10, No. 2, July 1967, page 164, and in U.S. Pat. No. 3,189,973, Edwards et al. However, the prior art has not appreciated the many applications which such a monocrystalline-polycrystalline epitaxial growth scheme might have.

For instance, in the above IBM Technical Disclosure Bulletin, it is taught only that the areas may be grown, and that diffusion takes place more rapidly into the polycrystalline silicon.

Further, in U.S. Pat. No. 3,189,973 the only germane disclosure is that polycrystalline silicon may be grown over an oxide. There is no teaching of the novel enclosed polycrystalline masses of this invention nor of the various capabilities thereof.

In U.S. Pat. No. 3,475,661, which issued Oct. 28, 1969, there is disclosed the growth of polycrystalline silicon over lines which are scribed on a substrate. Growth is not, however, to an enclosed structure as in the present invention, nor is there any realization of the novel utilization of substrate orientation which the present invention utilizes.

SUMMARY OF THE INVENTION

If a pattern of oxide is formed on a portion of a semiconductor substrate and then an epitaxial layer is deposited thereon, the epitaxial layer grown over the oxide pattern will be polycrystalline in structure while the remaining regions will be monocrystalline. With such a structure, advantage may be taken of the greater diffusion rate of impurities in the polycrystalline area to fabricate devices with laterally enclosed polycrystalline regions, i.e., buried subcollectors and underpass connections. By appropriate selection of the crystal orientation of the substrate, it is also possible to grown an initial polycrystalline region over the oxide followed by subsequent monocrystalline epitaxial growth over the polycrystalline material. Further, it is possible in one step, to form a single-crystal layer containing polycrystalline regions which are enclosed in single crystal material.

It is one object of this invention to provide improved devices using polycrystalline silicon, i.e., improved subcollectors and underpass connections.

It is a further object of the present invention to provide improved devices with completely enclosed polycrystalline regions which are, in effect, unitary with surrounding single-crystal material.

It is another object to provide an improved process for the formation of underpass connectors.

It is yet another object to provide an improved process for the fabrication of subcollectors in integrated circuits.

It is still yet another object of this invention to provide an improved process for forming polycrystalline regions enclosed, at least laterally, by single-crystal regions.

These and other objects of the invention will become clear upon a reading of the following material.

DETAILED DESCRIPTION OF THE PREFERRED EMBODIMENTS

As heretofore indicated, the present invention provides both integrated circuit devices and fabrication processes wherein polycrystalline silicon, and the unique capability of polycrystalline silicon to permit rapid diffusion due to grain-boundary diffusion, are utilized.

One aspect of the present invention is the fact that if a pattern of oxide, for instance silicon oxide, is formed on a semiconductor substrate and then an epitaxial material is grown from the vapor phase thereon, for instance, epitaxial silicon, a polycrystalline region can be formed which is completely enclosed on its sides with single-crystal material. Further, in yet another unique aspect of this invention, by appropriate selection of the substrate orientation, the growth of the polycrystalline region can be halted at a preselected point and monocrystalline growth continued thereabove without exterior alteration of the growth conditions. In this embodiment, the polycrystalline region is thus, if desired, completely enclosed by single-crystal regions.

Further, the rapid diffusion rate of impurities in the polycrystalline area can be utilized to fabricate active regions in the device such as buried subcollectors and underpass connectors illustrating lowered resistance.

In the following discussion, particular emphasis is given to the following embodiments of the invention: a buried subcollector formation scheme and an underpass formation scheme. It will be appreciated that the invention, of course, has much greater application than with these two specific instances.

In the discussion which follows, the semiconductor utilized was, of course, silicon. The oxide grown thereon was silicon dioxide. It will be appreciated by one skilled in the art that the other elemental and compound semiconductors could function equally well, and that complementary oxides could be used therewith. Further, as will be clear, the oxides grown or formed on the semiconductor substrate need not be identical to the substrate, but could be formed of some other compatible semiconductor material. Of course, when other semiconductors are used, it is necessary that the semiconductor be one which will deposit in a single crystal/polycrystal fashion as in the case of silicon.

Before starting the description of example 1, it is appropriate to discuss in detail the heretofore mentioned effect of the substrate orientation upon the polycrystalline region.

Figures 1, 2, 3, 4, 5, 6, 7:
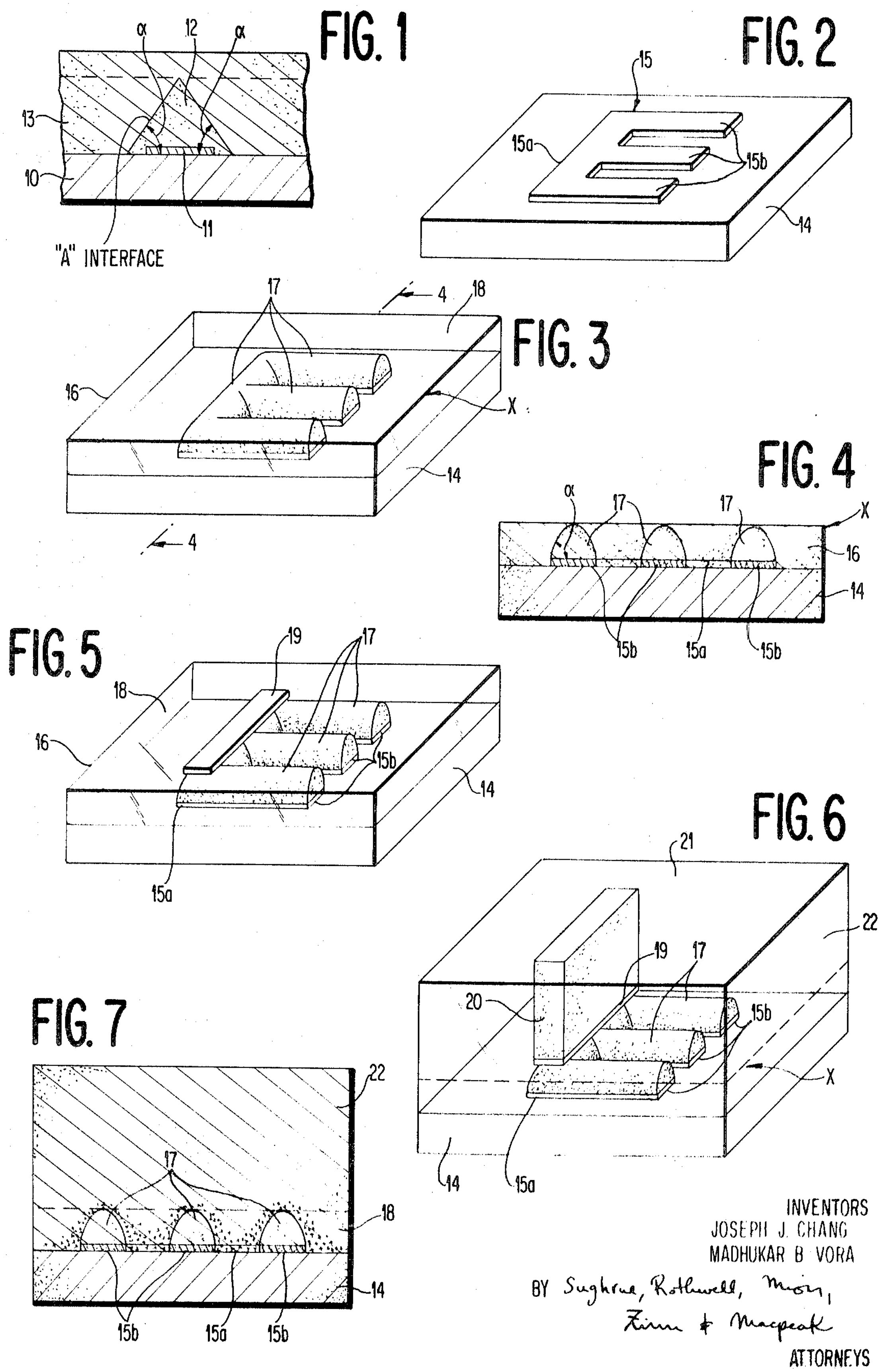
FIG. 1 is a representative view of the effect of substrate orientation on the invention.
FIGs. 2–8 are representative views of a first embodiment of this invention.
Figure 8:
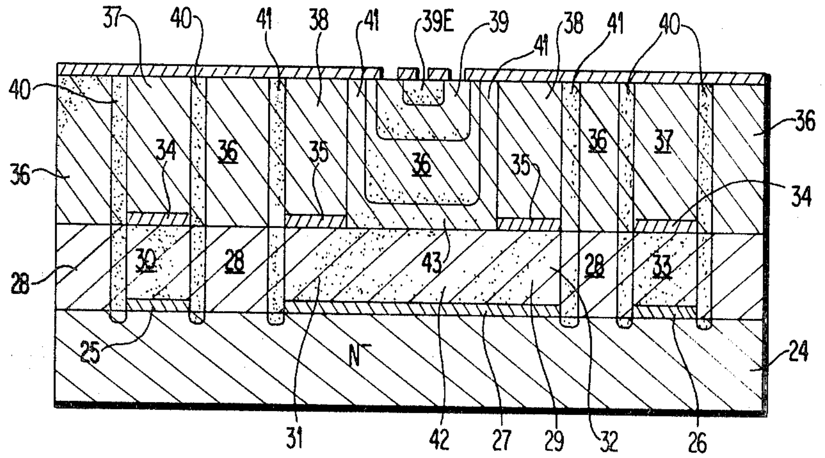

With reference to FIG. 1 the angle of the polycrystalline/single-crystal interface shown at "A" can be controlled by the substrate orientation. It has been unexpectedly found that the angle $\alpha$ varies as the orientation of the substrate 1 is varied. In FIG. 1, a silicon substrate 10 is shown with a circular silicon dioxide island 11 thereon. An epitaxial silicon layer was grown thereon by a vapor process and this layer comprised above the island 11 polysilicon regions 12, while on all sides thereof single-crystal regions 13 grew. Since it is one object of this invention to form a completely enclosed polycrystalline region, it is obvious that the "walls," i.e. the interface A, must converge. If the silicon substrate orientation is (1,1,1), the angle $\alpha$ is 54.44°, if the orientation is (2,1,1) $\alpha$ is 35.16°, and if the orientation is (3,1,1), $\alpha$ 25.16°. Although convergence can not be obtained where $\alpha$ 90°, this will result from a (1,0,0). orientation.

Thus, where one desires to form a polycrystalline region which converges as soon as possible, a (3,1,1) silicon substrate would be chosen, and if slow convergence is desired, a (1,1,1) substrate. The first example, below, uses a (1,1,1) silicon substrate to form the buried, enclosed subcollector described.

In the following discussion, the terms poly and polycrystalline will be used interchangeably, as will mono and single crystal, in describing the various types of silicon.

EXAMPLE 1

In this first example, diffusion is from a vertically extending channel of polycrystalline material to a laterally running polycrystalline "tunnel" or "finger." These terms will become clear in light of the following discussion which should be read in conjunction with FIGS. 2–8 of the drawings. This embodiment takes advantage of the fact that when silicon is grown epitaxially over a silicon substrate which has small islands of silicon dioxide thereon, polycrystalline silicon forms over the silicon dioxide and single-crystal silicon forms over the bare silicon surface. Further, if the growth rate of the epitaxial layers is carefully controlled in combination with the substrate orientation, it is possible to create a single-crystal zone over polycrystalline silicon. The substrate here was chosen with (1,1,1) orientation.

By taking advantage of the above facts, a novel subcollector structure for an integrated circuit can be formed without the complicated diffusion steps of the prior art. The basic process for this embodiment is as follows.

With reference to FIG. 2, one starts with substrate 14 of $P^+$ silicon having (1,1,1) orientation and having a 1¼ inch diameter and a thickness of 8 mils, the dimensions being substantially noncritical. The sheet resistivity of the substrate wafer 14 is 0.4 ohm-cm. Boron is the impurity.

The next step in the process is to grow a silicon oxide layer over the silicon substrate 14 by steam-oxidation. Any art process can be used. The oxide layer is etched to leave an island 15 on the surface of the silicon substrate 14. The island is, in this example, in the shape of a rectangular member 15*a* having three "fingers" or "islands" 15*b* extending therefrom. As seen in FIG. 2, the island 15 is basically in the shape of the letter "E," the portion 15*a* being 1 mil ×1 mil, and each finger 15*b* being 1 mil ×0.2 mil (length) and spaced 0.2 mils apart. Obviously, if one desires to directly form an individual silicon dioxide island or islands on the silicon substrate, the etching step would be omitted. Any standard state of the art techniques can be used to form the silicon dioxide layer which is etched to yield the islands 15. The thickness of island 15 is approximately 5,000 A. microns. The island or strip 15 of silicon dioxide left on the silicon surface will, of course, form the basis for growing a polycrystalline tunnel or lateral structure 17.

An epitaxial silicon layer 16 5 microns deep (resistivity =5 ohm-cm.) is grown over the island 15 and substrate 14 by the well known silane depositing process at 1,200° C. The silicon substrate 14 yields a polycrystalline tunnel 17 over the dioxide island 15 but yields a single-crystal surrounding structure 18 over the bare portions of the substrate, that is, the portion of the silicon which is not covered by the oxide island 15. Growth should be stopped when the single-crystal material begins to form on the tunnel 17. At this stage of the process, the device can be illustrated in perspective as shown in FIG. 3 of the drawings.

The subcollector formation at this point takes advantage of the fact that polycrystalline silicon, grown epitaxially over oxide, can be caused to converge the degree of convergence depending on the crystal orientation of the substrate. In this case since the substrate 14 was chosen to have (1,1,1) orientation, the polycrystalline silicon, as shown in FIG. 4, converged with an $\alpha$, or interior angle of convergence, of 54.44°. With the islands of the size involved, the epitaxial layer was 5 microns thick when, essentially, the converging sides of the polyregion met, and polygrowth stopped. From this point on, of course, epitaxial vapor deposition will provide single-crystal material. Thus, as will become clear from the following explanation, the lateral "tunnels" 17 can be completely enclosed with single-crystal silicon in a single-process operation. FIG. 4 is along line 4—4 of FIG. 3. After convergence, the monocrystalline silicon is grown above the polycrystalline stratigraphy since, as stated, polygrowth will not extend above the point of convergence at $x$.

Just after the single crystal begins to form on the tunnel, i.e., when the single crystal has grown an additional 2 microns over the tunnel 17, though this thickness is substantially noncritical, the new single-crystal surface should be oxidized to yield a silicon dioxide layer. Oxidation can be by any standard state of the art process, for instance by low temperature steam oxidation. The oxide which is formed is 5,000 A. thick and is etched with HF from the complete surface of the device except from the region 19 which is directly over the polycrystalline tunnel 17 corresponding to pattern 15*a*. The device at this point is shown in FIG. 5 of the drawings. The new silicon dioxide island 19 which is formed over the part of the polycrystalline tunnel 17 will form the basis for an upwardly extending polycrystalline pillar or channel 20 through the surface 21 of the integrated circuit device. This polychannel 20 will link the polycrystalline tunnel 17 which will be the subcollector, to the surface of the device 21 for any contacts which need be made.

Obviously, with the structure described, a silicon dioxide layer which is etched away to give island 19 is not required, and island 19 could be formed by any art process. Generally, the silicon dioxide "pattern" 19 will have thickness of 5,000 A. to permit good polygrowth thereabove, though this is noncritical. 500 A. is a minimum for good results.

Continuing now with a description of this embodiment of the invention, with reference to FIG. 6, the next step is to grow epitaxial silicon layer 21. This layer is grown to a thickness of 2 microns, and a polycrystalline pillar 20 forms over the silicon dioxide island 17.

At this time it should be pointed out that polycrystalline silicon will also grow to the side of the silicon dioxide islands 15. This is because the sides of the silicon dioxide will also provide growth sites for the polycrystalline silicon. Thus, the island will be "ringed" by polycrystalline silicon which grows sideward. Typically, this growth will be along the lines of 0.5 mil. This growth is significant because silicon dioxide is a good mask against impurity diffusion. Thus, it is believed that the majority of impurity diffusion past the silicon dioxide mask will occur through this "ring" of polycrystalline silicon which has grown out to the sides of the silicon dioxide island. Surprisingly, no significant problem has been encountered in reduced impurity concentrations in those polycrystalline areas below the silicon dioxide masks, and it thus seems that the "ring" of polycrystalline silicon provides an ample rapid pathway for diffusing impurities. Recent experiments have indicated, in fact, that the diffusion rate through polycrystalline silicon may at times be as high as 20 times that through monocrystalline silicon.

Figures 9, 10, 11, 12, 13:
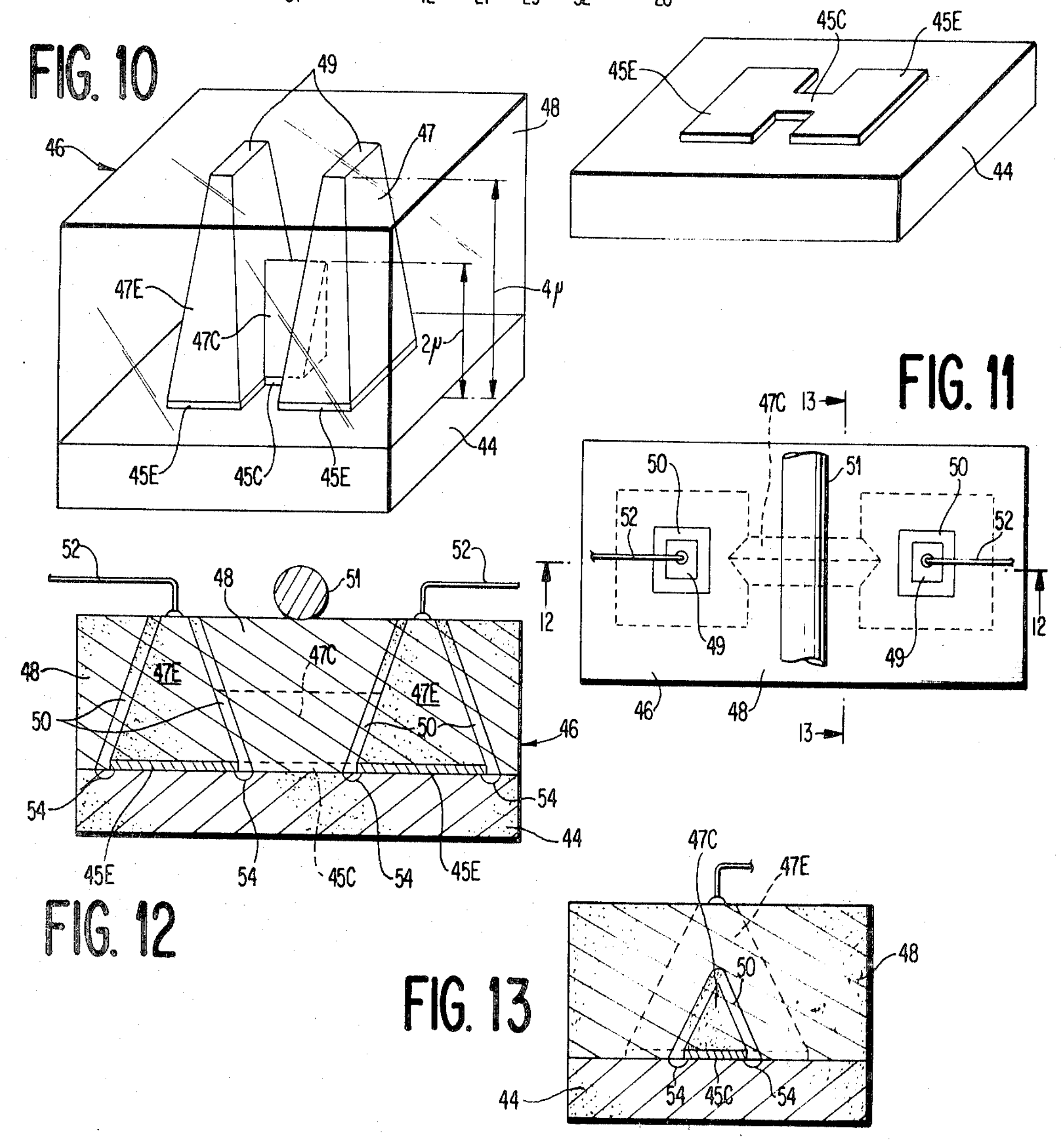
FIGS. 9–13 are representative views of a second embodiment of this invention.

At this time it is appropriate to describe an embodiment which obviates the need for the second silicon dioxide island. In this embodiment, the relatively simple concept is utilized of choosing silicon dioxide islands of different areas. Obviously, an island which is larger will permit a "higher" polycrystalline portion to be grown before convergence occurs then a relatively narrower silicon dioxide island. This is due to the fact that as long as the angle of convergence $\alpha$ is equal, which it will be for the same substrate, if one starts with converging lines further apart, a longer distance will be required before polycrystalline growth halts. Advantage can be taken of this fact in forming the subcollector shown in the drawings. Specifically, if the portion 15*a* is selected to have its sides further apart than the portions 15*b* than polycrystalline silicon which grows over portion 15*a* will converge later than polycrystalline silicon which grows over portion 15*b*. Thus, the "fingers" of the subcollector will naturally converge at an earlier time than the polycrystalline material above portion 15*a*, and the portion above 15*a* can be continued to provide itself the fast diffusing vertical tunnel. For instance, a 1 mil by 1 mil silicon dioxide island 15*a* can grow polysilicon to a depth of 5 microns, but fingers 15*b* 1 mil ×0.2 mil (as heretofore described the 0.2 mil dimension is the length of the fingers) will only be covered with polysilicon to a depth of 2 microns. Thus, one could grow the epitaxy to a total depth of 4 microns, have the fingers 15*b* completely covered by 2 microns of monoepitaxy, and yet have a vertically extending pillar of polysilicon which derives from the first, or original, silicon dioxide layer 15*b* and which extends completely to the surface of the device.

Where this one island, or one epi layer, embodiment is utilized, it will not be necessary to grow a second silicon dioxide island. Accordingly, there will be no barrier to diffusion. However, it will be apparent that when the one epi layer process is utilized, it will not be possible to grow a pillar having the total height which can be utilized with the two or more layer epi process. This pillar, of course, extends all the way to the surface of the integrated devices heretofore discussed, at a thickness equivalent to the epitaxial layer 22. After growth of the epitaxial layer 21 and formation of the pillar 20, the device is shown in FIG. 10 of the drawing. Of course, the single-crystal structure 22 comprises the epitaxial layer 21 over the remainder of the device other than the region of the pillar 20. The pillar 20 is equal in area to the island 19.

The pillar 20 and the subcollector tunnel 17 provide a fast diffusing vertical and lateral path for either P+ or N+ impurities. For instance, by masking the complete surface of the device except for the pillar opening 23 shown in FIG. 6, for instance masking with a P+ or N+ resistant material such as $SiO_2$ to a thickness of 5,000 A. the P+ or N+ impurity can be driven down the channel 20 and laterally into the tunnel 17 thereby yielding the subcollector. Of course, a thin "skin" of impurity forms over the interface of the polycrystalline tunnel 17, pillar 20 and the remainder of single-crystal silicon mass 22.

To further expand upon the above, since P or N impurities will diffuse three times as fast, or even faster, through poly as through monosilicon, diffusion (even without surface masking) occurs very rapidly down pillar 20 and sideways to the end of the tunnel or "fingers" 17. Some lateral or outdiffusion in monoareas 22 will occur. This is of importance at the areas between adjoining "fingers" as the novel subcollector of this invention actually comprises the member 15*a* and fingers 15*b* and the areas therebetween. However, on diffusion, the impurities diffuse from the fingers 15*b* into the single-crystal material 18 and 22 as shown in FIG. 7, which is a schematic representation of the fingers 15*b* after diffusion. The impurity density is roughly proportional to darkness. The impurity zones around each "finger" 17 need not overlap, and will typically have a concentration the same as the emitter of about $10^{21}$ atoms/cc. Actually, the impurity level surrounding each "finger" 17 is a maximum in a thin "skin" around the "finger" 17, and thereafter decreases radially outward from the "finger" 17 until the impurity zone from the next "finger" 17 is encountered. So long as adequate electrical contact is made between the fingers 17, say on the order of $10^{20}$–$10^{21}$ atoms/cc. and the subcollector function can be performed, no other special parameters need be observed.

In this particular example, diffusion was with phosphorous which is N+. The final concentration in the pillar 20 was $10^{20}$ atoms/cc. and in the "fingers" 17, $10^{21}$ atoms/cc. Diffusion was at 1,000° C. for 1 hour using a high-temperature $PoCl_3$-containing atmosphere.

The effect of crystal orientation on the polyregions which are grown was explained above. The following discussion shows how, for instance, one might use the 54° interior convergence angle of polycrystalline silicon on a (1,1,1) substrate in the integration of a PNP-transistor. It is not believed necessary to go into great detail as PNP-transistors and integrated circuits are well understood in the art. The following discussion is with reference to FIG. 8.

Starting with an $N^{TE}$ substrate 24, silicon dioxide islands are permitted to remain thereon. As stated, the silicon had an orientation of (1,1,1). This is equal to an $\alpha$ or interior convergence angle of 54.44°. Needless to say, are (2,1,1) or (3,1,1) orientation would serve as well. Islands 25 and 26 will form the isolation walls after polycrystalline material is grown thereon, and island 27 will form the subcollector tunnel. The next step is to grow the epitaxial silicon layer. This epitaxy layer will comprise the polyregions 30, 31 and 33 over the silicon dioxide islands 25, 27 and 26, respectively, and the single-crystal portions 28 over the "unoxidized" substrate. In this thickness the poly regions have converged, and no further polygrowth will occur unless a new $SiO_2$ island is provided. These islands are provided exactly as in the heretofore detailed example, i.e., forming a thin epi, oxidizing the epi to $SiO_2$, and etching the $SiO_2$ to expose the underlying single crystal but for those regions 34, 34 and 35, 35. These will be directly over the already grown "converged" polyregions 30, 33 and 31, 32, respectively, and these new $SiO_2$ islands will form the growth centers for the upwardly extending polypillars. The polymaterial under the islands, of course, will form the bottoms of the isolation wall (30,33) and collector reach (31,32) through pillars.

As soon as the silicon dioxide islands are grown, an epitaxial layer 35 is grown by the known silane deposition to a thickness insufficient to converge poly over the whole device. Polycrystalline masses 37,37 and 38,38 will grow over the islands 34,34 and 35,35, respectively. Of course, in the regions identified by numeral 36, the single-crystal lattice structure of the single-crystal epitaxial layer 28 will be grown or extended.

The next step will be open holes over isolation pillers 37 and 37, and to open a hole over the base region 39. Due to the approximately three-fold diffusion rate difference between the base formation zone (single crystal) and the isolation pillars (polycrystal), one simultaneous diffusion step can be used to form both the isolation walls 40 and the base region 39. In this instance, to identify the stratigraphy of the PNP-transistor of FIG. 8 (this should be compared to the NPN-transistor of FIG. 6), layers 28 and 36 are P-type epitaxial layers; polycrystalline pillars 30 and 37 and $N^+$ diffusion, of course, the lateral diffusions 31 and 41 into the single-crystal material 36 are $P^+$; base 39 is an $N^+$diffusion, and emitter 39E is a $P^+$ diffusion. The P-type impurity utilized was boron, and the N-type impurity utilized was phosphorous. All concentrations are to standard state of the art values, in other words, one skilled in the art can use emitter and base, etc. impurity concentrations as the art heretofore utilized, and need not diverge from the thermal cycles heretofore used.

Of course, subcollector 42 diffusion will occur simultaneously with $P^+$ emitter 39E diffusion. The concentrations of these two will be identical.

Subcollector 42 diffusion occurs by removing the mask over region 39E and over polypillars 38,38. The three times as rapid diffusion through polysilicon permits the buried subcollector 42 to be formed simultaneously with the relatively smaller $P^{TE}$ emitter 39E inside the $N^+$ base 39. Of course, the subcollector diffusion will yield pillar walls 41,41 which are laterally extended. In this instance, a small upwardly grown $P^+$ layer 43 microns thick will result from diffusion upwardly from the buried subcollector. With the rapid diffusion rate through polycrystalline silicon the P impurities will be driven down the pillar through the subcollector and begin to slightly "out diffuse" back into the epitaxial layer 36 before emitter diffusion is completed.

It should be especially noted that by using this process only two diffusion steps are required to form an integrated circuit.

The above material comprises a preferred embodiment utilizing the rapid diffusion capabilities of epitaxial polycrystalline silicon in forming a buried subcollector.

EXAMPLE 2

The following embodiment provides a polycrystalline underpass utilizing the concepts heretofore described. Reference should be made to FIGS. 9 to 13 of the drawings for a complete understanding of this feature of the invention.

An underpass is, of course, a device used on integrated circuits when two interconnecting lines have to cross each other without electrical short circuit. The present process provides a polycrystalline underpass with very low resistance. For instance, resistances on the order of 10 ohm/□ are easily obtained by following the processing scheme of this invention to obtain the novel underpass of this invention.

One would start with, for instance, as shown in perspective in FIG. 9, a P silicon substrate 44 of (1,1,1) orientation with a boron concentration of $10^{15}$–$10^{16}$ and grow an oxide layer thereon. Obviously, with reversal of all impurities, an N substrate could also be used. This example, of course, deals with an NPN-transistor. As heretofore indicated, any of the other semiconductors heretofore recited could be used. The silicon slice 44 described had the dimensions of 1¼×1¼ inches and had a thickness of 8 mills. The resistivity of the substrate was 0.4 ohm-cm. The oxide layer was grown thereon by the low temperature steam oxidation technique, commonly known in the art. The thickness of the silicon dioxide layer was 5,000 A. microns. The silicon dioxide layer was next etched out to leave only $SiO_2$ area 45 in an H-shaped pattern, as shown in FIG. 9, which is a top perspective view of the underpass formation after silicon dioxide etch.

The dimensions of the H-shaped pattern are 1 mil ×1 mil for both end portion 45E, and 0.2 mil ×0.2 mil for the central portion 45c.

Next, a layer of N-epitaxial silicon 46 with a 5 ohm-cm. resistivity (phosphorus), is grown over the complete device using the well known silane technique at 1,200° C. Polycrystalline silicone areas 47E and 47C grow over the silicon dioxide pattern at portions 45E and 45C, respectively, which remain after etching, and single-crystal silicon 48 grows over the rest of the surface where silicon dioxide is absent, i.e., the "base" silicon substrate 44. The total thickness of the epitaxial layer which resulted was 5 microns.

With specific reference to FIG. 10, this shows the underpass formation immediately after the growth of the epitaxial layer which comprises polyportions 47 and monoportions 48. Again, in this particular embodiment, the converging capabilities of polysilicon over a (1,1,1) crystal substrate have been utilized.

As heretofore explained, at the same angle of convergence it will take a greater height for the two lines to converge when they are initially further apart. Thus, it will take the polysilicon a longer period of time to converge which is over portions 45E than the polysilicon which is over portion 45C. In fact, as FIG. 10 shows, the polysilicon portion 47C will converge at a vertical height of approximately 2 microns, whereas, if permitted to grow, the polysilicon portions 47E will not converge for approximately 5 microns. Since the total depth of the epi layer 46 is only 4 microns, the buried portion of the underpass 47C has converged, and single-crystal silicon thereover will provide insulation, whereas the end or terminal portion of the polysilicon 47E have not yet converged and provide a natural diffusion pathway. With reference to FIG. 10, it can be seen that if the portions 47E, 47E of the polycrystalline pillars were grown another micron, to a total height of 5 microns, they would converge. However, the portions 49,49 exposed to the surface of the epitaxial layer 46 naturally provide a convenient entrance to the laterally extending underpass portion 45C of the polycrystalline material.

The next step is to diffuse a $P^+$- or $N^+$-type impurity into the polycrystalline silicion structure 47 through the top portion 49. This is done after masking all the top area but portion 49. In this embodiment, diffusion was at 1,000° C. with phosphorous to yield a concentration in the single-crystal material 48, which surrounds polycrystalline structure 47 of approximately $10^{21}$ atoms/cc. and an impurity concentration in the polycrystalline portion of $10^{21}$ atoms/cc. (same as the emitter). Again, as heretofore, the rapid diffusion capability of the polycrystalline silicon structure 47 permits either $P^+$ or $N^+$ impurities to form very low resistance, i.e. high impurity paths in a polychannel while, at the same time, minor diffusion into surrounding single-crystal silicon occurs. At the above conditions diffuse into the single-crystal material occurs to a lateral depth of 1 micron into the single crystal 48. In FIG. 11, this lateral diffusion is represented by numeral 50. Diffusion into the P+ silicon substrate 44 per se does not occur to any great extent because of the silicon dioxide pattern 45, but some pocket diffusion does occur at points adjacent the intersection of the sides of pattern 45 and substrate 44. The next step in this embodiment is to grow an oxide layer over the device, and open holes for the standard contact metallurgy known to the art. In this instance, aluminum contacts are used.

The device, after completion, is partially shown, in a representative top view, in FIG. 11 of the drawings. The view along line 12—12 is shown in FIG. 12 and a subsectional view along line 13—13 is shown in FIG. 13 of the drawings.

Since FIGS. 11–13 represent only a single-underpass scheme, it is obvious that some of these could be combined to give a more complicated device geometry. Resistance is extremely low in such a device.

With reference now to FIG. 11, reference number 49 denotes the top of the H-shaped polycrystalline mass shown by 47 in FIG. 10. All numerals used in FIGS. 9—10 have the same meaning in FIG. 11. Surrounding this polycrystalline mass on all points, and represented by reference numeral 50, is, of course, the minor diffusion heretofore referred to which will occur laterally from the polycrystalline mass into the single crystal material. It will be appreciated that surrounding the complete schematic of FIG. 11 is single-crystal material, and this diffusion, which is either $P^+$ or $N^+$, is actually into the single-crystal material. Of course, reference numeral 51 represents the one electrical line, and reference numerals 52,52 represent the other two lines which are interconnected beneath the electrical line 51 by the underpass assembly itself which comprises the highly doped polycrystalline material 47.

From the above discussion it will be clear that a highly doped polycrystalline material is necessary in order to provide adequate conductivity beneath the connection 51. Of course, this is for optimum results, and for the best results it is generally found that a doping concentration in the general area of $10^{21}$ atoms/cc. is acceptable. Obviously, this will be decided by device characteristics and by the impurity used etc. Typically, emitter-level doping is used.

With reference now to FIG. 12, this shows, in part, a cross-sectional view taken along line 12—12 of FIG. 11. The same reference figures are used in FIG. 11, with the exception that in this drawing the single-crystal material 48 which surrounds the polycrystalline mass 47 is more adequately shown. Further, in this drawing contacts, which are aluminum metallurgy, are represented by numerals 52,52. It should be noted that at this time the "pocket diffusions" heretofore referred to at the sides of pattern 45 and 44 are clearly shown and denoted by reference numeral 54. These extend only about 1 micron into the substrate 44.

Finally, FIG. 13 represents a partial cross-sectional view taken along line 13—13 of FIG. 11. This is primarily to show the relationship at the narrower part of the underpass which passes immediately beneath the electrical connection 51. With reference to FIG. 13, the same reference numerals as are utilized in FIGS. 14 and 15 are used, and it is believed that the impact thereof will be clear.

While the invention has been particularly shown and described with reference to preferred embodiments thereof, it will be understood by those skilled in the art that various changes in form and details may be made therein without departing from the spirit and scope of the invention.

1. A semiconductor device comprising

We claim:

1. A semiconductor device comprising a substrate selected from the group consisting of silicon having a [1,1,1] orientation, silicon having a [2,1,1] orientation and silicon having a [3,1,1] orientation, a first member of doped polycrystalline silicon on said substrate, said first member not extending to the periphery of said substrate, a single crystalline epitaxial layer of silicon on said substrate and covering said first member, said epitaxial layer constituting an extension of the original crystalline structure of said substrate, a second member of doped polycrystalline silicon extending through said epitaxial layer from a first portion of said first member to the surface of said epitaxial layer opposite said substrate, said first and second members having an impurity concentration at least of the order of about $10^{20}$ atoms/cc. and a current carrying element located above said first member and supported by said epitaxial layer.

2. The semiconductor device defined in claim 1 wherein said first member comprises a plurality of extending portions joined at one end to said first portion.

3. The semiconductor device defined in claim 1 wherein a film of silicon dioxide is between said first member and said substrate.

4. The semiconductor device defined in claim 1 wherein said current-carrying element comprises a transistor.

5. The semiconductor device defined in claim 1 and further including a third member of doped polycrystalline silicon extending through said epitaxial layer from a second portion of said first member to the surface of said epitaxial opposite said substrate, said third member having an impurity concentration at least of the order of about $10^{20}$ atoms/cc.

6. The semiconductor device claimed in claim 1 wherein said current-carrying element comprises an electrical line.

* * * * *